United States Patent [19]

Klar et al.

[11] Patent Number: 4,606,060
[45] Date of Patent: Aug. 12, 1986

[54] CHARGE COUPLED DEVICE (CCD) INPUT CIRCUIT OPERATING ACCORDING TO THE FILL AND SPILL PRINCIPLE

[75] Inventors: Heiner Klar; Manfred Mauthe, both of Munich, Fed. Rep. of Germany

[73] Assignee: Siemens Aktiengesellschaft, Berlin and Munich, Fed. Rep. of Germany

[21] Appl. No.: 699,505

[22] Filed: Feb. 11, 1985

Related U.S. Application Data

[63] Continuation of Ser. No. 479,852, Mar. 28, 1983, abandoned, which is a continuation of Ser. No. 62,152, Jul. 30, 1979, abandoned.

[30] Foreign Application Priority Data

Aug. 21, 1978 [DE] Fed. Rep. of Germany ....... 2836473

[51] Int. Cl.[4] .................. G11C 19/28; H01L 29/78
[52] U.S. Cl. .......................... 377/60; 377/62; 357/24
[58] Field of Search ............... 357/24; 377/57–63

[56] References Cited

U.S. PATENT DOCUMENTS

| | | |
|---|---|---|
| 3,937,985 | 2/1976 | Cooper .................................. 357/24 |
| 3,969,634 | 7/1976 | Su et al. ............................... 357/24 |
| 4,139,784 | 2/1979 | Sauer .................................. 357/24 |
| 4,158,209 | 6/1979 | Levine ................................. 357/24 |
| 4,230,952 | 10/1980 | Knauer ................................ 357/24 |
| 4,412,343 | 10/1983 | Kosonocky ......................... 357/24 |

OTHER PUBLICATIONS

Sequin et al, "Linearity of Electrical Charge Injection into Charge-Coupled Devices", IEEE J. Solid-State Circuits, vol. SC-10 (1975) pp. 81–92.

Weste et al, "MOST Amplifiers for Performing Peripheral Integrated-Circuit Functions", Electronic Circuits and Systems, vol. 1, No. 5 (9/77) pp. 165–172.

Primary Examiner—Gene M. Munson
Attorney, Agent, or Firm—Hill, Van Santen, Steadman & Simpson

[57] ABSTRACT

A charge coupled device (CCD) input circuit operates according to the fill and spill principle. An arrangement of a distributor electrode and a barrier electrode, and a drain diode laterally adjacent the electrode row, provide for the separation and removal of an undesirable d.c. component from the a.c. component of the signal. The optimum working point, in contrast with known CCD input circuits, lies at full modulation. The invention provides the system having a high degree of linearity with a high amplification.

1 Claim, 5 Drawing Figures

CHARGE COUPLED DEVICE (CCD) INPUT CIRCUIT OPERATING ACCORDING TO THE FILL AND SPILL PRINCIPLE

This is a continuation of application Ser. No. 479,852 filed Mar. 28, 1983 which is a continuation of application Ser. No. 062,152, filed July 30, 1979; prior applications Ser. No. 479,852 and Ser. No. 62,152 are now abandoned.

BACKGROUND OF THE INVENTION

1. Field of the Invention

The present invention relates to a charge coupled device (CCD) input circuit which operates according to the fill and spill principle and which comprises an input diode, several input electrodes, and several shift electrodes arranged behind the input electrodes.

2. Description of the Prior Art

CCD input circuits, which are operated according to the fill and spill principle, also simultaneously serve as charge amplifiers. By virtue of the fact that the input collector has an enlarged surface area, as compared with the CCD shift electrodes, the specific charge can be increased. Since, however, the entire charge quantity, consisting of a "fat zero" and the signal component, must be received by a CCD electrode, the operating point must be set low for the input, corresponding to the amplification. Only the a.c. component is to be amplified and not, however, an undesired d.c. component of a respective charge. With increasing amplification, the working point of the input drifts into the start-up slope, as a result of which distortions occur.

A linearization of the CCD input has heretofore been achieved by means of "dipping" or by means of feedback or regeneration—cf. e.g. N. Weste and J. Mavor: "M.O.S.T. amplifiers for performing peripheral integrated circuit functions", printed in the periodical Electronic Circuits and System, 1977, Vol. 1, No. 5.

Surface CCD's (SCCD) having uniform oxide thicknesses are known, which are operated according to the fill and spill principle, which manifest a double surface charge amplification. Since the signal must flow over a threshold, only half the frequency of the surface potential is available for the input electrodes, as compared with a CCD electrode. The surfaces of the control gates, and of the first CCD electrodes, are therefore twice as great as the subordinate CCD electrodes, cf. e.g. C. H. Sequin and A. M. Mohsen: "Linearity of Electrical Injection into Charge-Coupled Devices", published in the IEEE Journal of Solid-State Circuits, Vol. SC-10, No. 2, April 1975, pp. 81–92. It is disadvantageous here that the optimum operating point for the input lies at half the full drive.

SUMMARY OF THE INVENTION

It is therefore the object of the present invention to provide a CCD input circuit which operates according to the fill and spill principle, wherein the optimum working point lies more favorably than in the case of known conventional circuits, and wherein a co-amplified undesired d.c. component of a respective charge is rendered ineffective.

The foregoing object is achieved, according to the present invention, in a CCD input circuit of the type generally mentioned above, which operates in accordance with the fill and spill principle, and having an input diode, several input electrodes, and several shift electrodes arranged behind the input electrodes, and which circuit is particularly characterized in that the surface of a first shift electrode or of a second shift electrode, respectively, is in each case equal to the sum of the surfaces of a second input electrode and a third input electrode; furthermore, between the second shift electrode and a fourth shift electrode, a distributor electrode and a barrier electrode are arranged and connected to a fixed potential which corresponds to half the clock pulse amplitude. The surface of the distributor electrode and the magnitude of the barrier which can be produced by the barrier electrode are dimensioned such that an undesired d.c. component of the respective charge remains beneath the distributor electrode, and the a.c. component lies above the barrier. A drain gate and a drain diode are arranged laterally of the electrode row between the distributor electrode and the barrier electrode, and two shift electrodes following the barrier of the electrode are each provided with a larger surface than all following shift electrodes, respectively.

The present invention offers the advantage that the input can be operated at its optimum working point at full drive. Since the charge must flow over a barrier, the co-amplified undesired d.c. component is advantageously subtracted. Simultaneously, the co-amplified a.c. component is amplified in accordance with the surface area. Therefore, the difference between the barrier and a resulting new a.c. operating point is increased. The linearity is therefore improved.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENT

Figure 1:
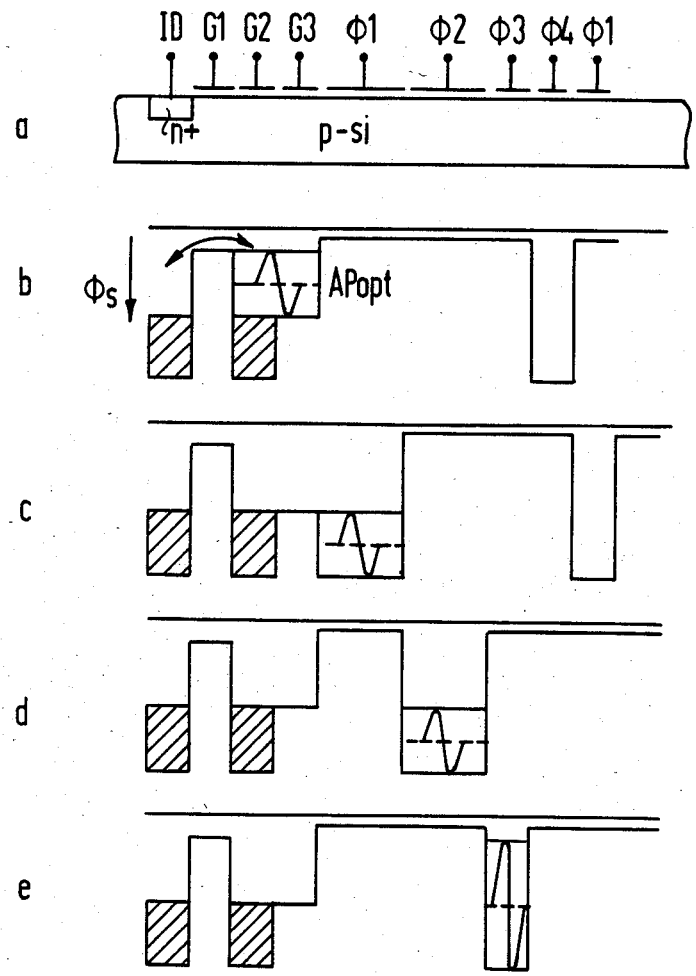
FIG. 1 schematically illustrates a conventional CCD input circuit and diagrammatrically illustrates the operation thereof.
Figure 4:
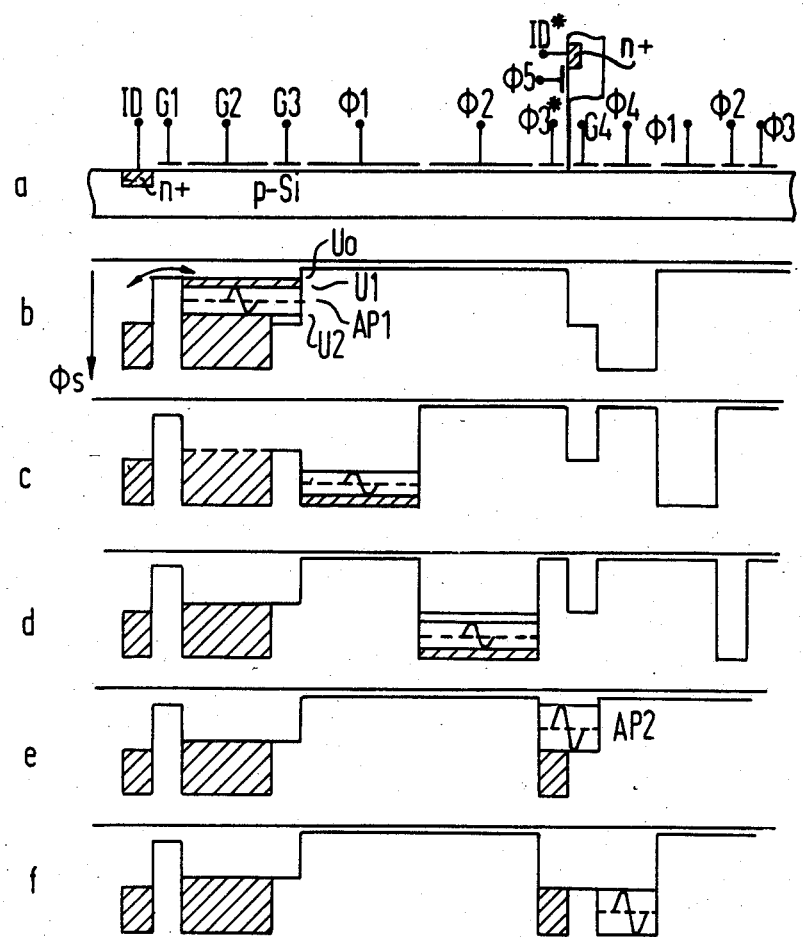
FIG. 4 illustrates a CCD input circuit constructed in accordance with the present invention.
Figure 5:
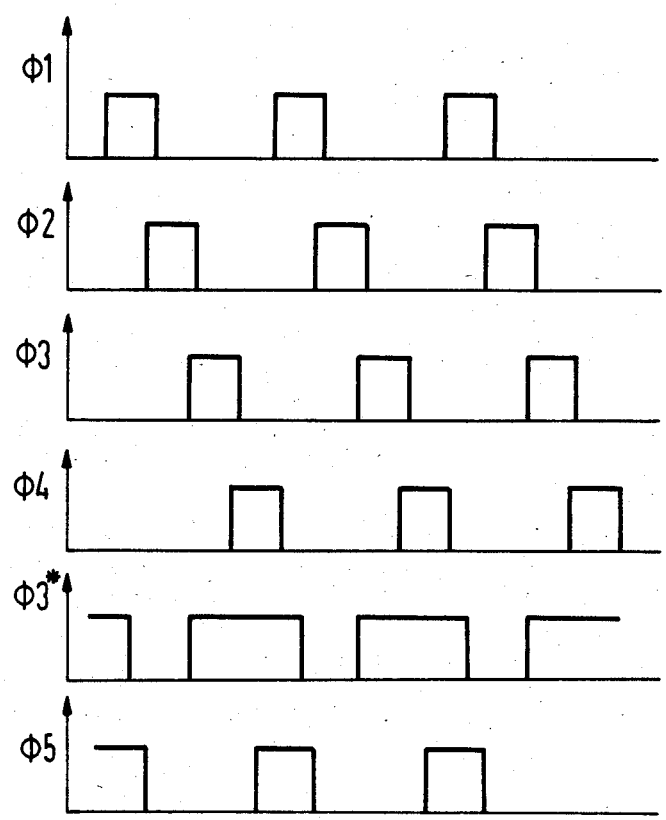
FIG. 5 is a timing diagram of the clock pulse plan for operating the CCD input circuit of FIG. 4.

Before turning to FIG. 4, the conventional CCD input circuit of FIG. 1 comprises an input diode ID, a first input electrode G1, a second input electrode G2, and a third input electrode G3, and is operated according to the fill and spill principle. An input signal $\phi_s$ undergoes a double surface charge amplification. Since the signal charge must flow over the threshold of the electrode G3, only half the frequency of the surface potential is available for the input electrodes, as compared with a CCD electrode. The surfaces of the input electrodes and of the first CCD electrodes are therefore twice as great as the following CCD electrodes. The optimum operating point APopt for the third input electrode G3 lies, as illustrated, at half the full drive.

Figure 2:
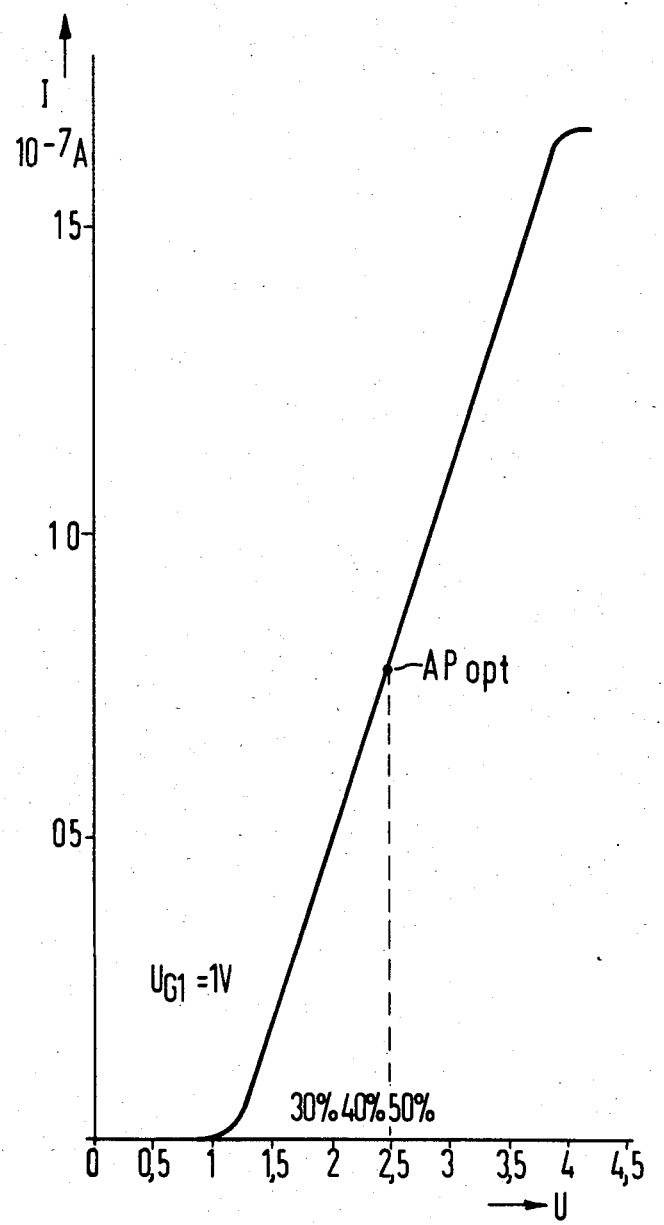
FIG. 2 is a graphic illustration showing the characteristic curve of a CCD input circuit designed in accordance with FIG. 1.

This is also illustrated on the characteristic curve of FIG. 2.

Figure 3:
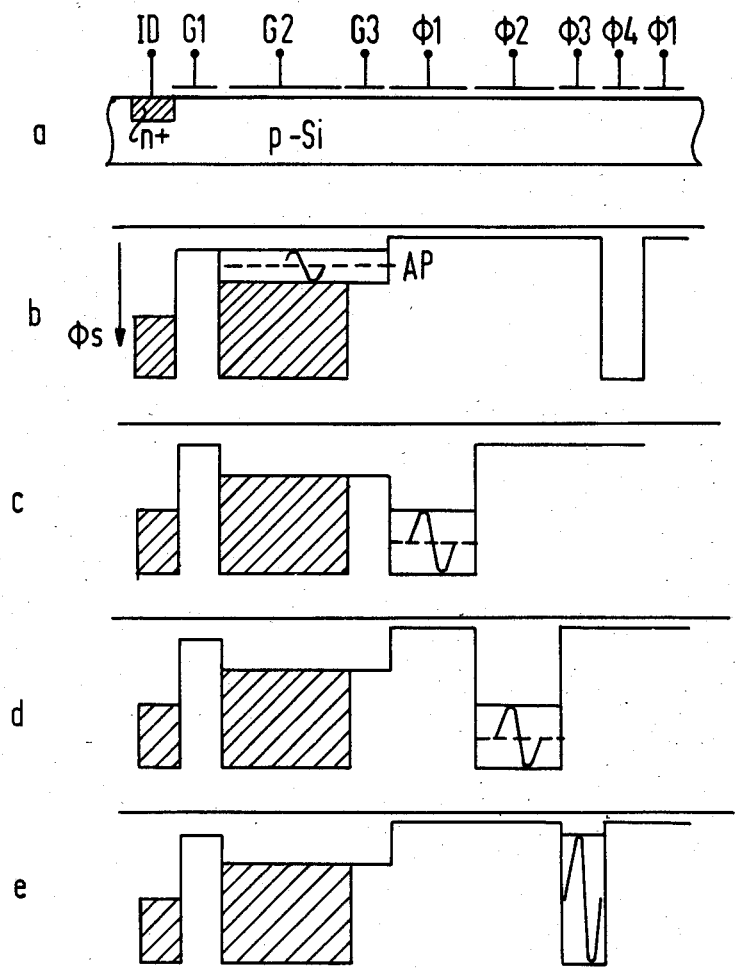
FIG. 3 illustrates a conventional CCD input circuit which fundamentally corresponds to that illustrated in FIG. 1, and diagrammatrically illustrates the operation thereof.

In FIG. 3, a CCD input circuit, again a conventional circuit, is illustrated which fundamentally corresponds to that of FIG. 1, but manifest a quadruple amplification. As is apparent, the full drive of the input electrodes G2 and G3 now amounts to only a quarter of that for a CCD electrode. The operating point AP decreases by the amount of the amplification factor. As FIG. 2 illustrates, the input, having a low operating point, is increasingly operated in the non-linear starting region.

Referring now to FIG. 4, a CCD input circuit constructed in accordance with the present invention is illustrated. This arrangement also has an amplification of four. The input operating point AP1 is optimally selected. Particularly identified is the possible range of drive (U1-U2) and the d.c. component (U0-U1) to be subtracted. The charge stored under the electrodes G2 and G3 flows, with the first shift pulse $\emptyset1$, beneath the first shift electrode. In order to prevent a charge flow-back, the first two shift electrodes are respectively laid out, in terms of surface area, to be equal to the sum of the surfaces of the electrodes G2 and G3. The subtraction of the d.c. component occurs due to a barrier electrode G4 which is arranged behind a distributor electrode $\emptyset3^*$. A d.c. voltage, which corresponds to half the clock pulse amplitude, is applied to the electrode G4. With a clock pulse applied to the distributor electrode $\emptyset3^*$, the charge beneath the electrodes $\emptyset3^*$ and G4 is distributed. The surface area of the electrode $\emptyset3^*$ and the magnitude of the barrier provided by the electrode G4 are dimensioned such that the undesired d.c. component is located beneath the electrode $\emptyset3^*$, and the a.c. component is located above the barrier. With the clock pulse $\emptyset4$, the signal charge now flows beneath the next electrode, and the d.c. component remains under the electrode $\emptyset3^*$. The d.c. component is drawn off by way of a laterally-mounted drain gate $\emptyset5$, or a drain removal diode ID*, with the aid of a drain-off clock pulse. Since, under the electrode $\emptyset3^*$, the entire frequency in the CCD is utilized, an amplification of the signal occurs. The a.c. operating point AP2 is therefore optimum, like the input operating point AP1, and hence in a more linear area of the input characteristic curve. For the gates $\emptyset3^*$ and G4, the same conditions apply as for the gates G2 and G3. The two electrodes following the barrier electrode G4, have twice the surface area of all following CCD electrodes.

The present invention is not restricted to a CCD having a four-phase operation. On the contrary, it can also be related to a two-phase CCD or a three-phase CCD.

With the improved linearity of a CCD input circuit constructed in accordance with the present invention, as compared with known CCD input circuits, filter arrangements can be advantageously realized with CCD resonators in which maximum amplification factors of 5-10 are desirable.

Although we have described our invention by reference to particular embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a charge-coupled device of the type having a substrate and an input which operates in accordance with the fill and spill principle in which a charge is moved over a barrier from one potential well to another, and which has an input diode, a plurality of linearly aligned input electrodes including first, second and third input electrodes, and a plurality of linearly aligned shift electrodes including first, second, third and fourth shift electrodes, the improvement therein comprising:

said first and second shift electrodes linearly mounted in a first direction and said first and second shift electrodes each having surface areas which are equal to the sum of the surface areas of said second input electrode and of said third input electrode; a distributor electrode aligned with and mounted adjacent to said second shift electrode for receiving a clock pulse;

a barrier electrode linearly mounted between said distributor electrode and said third shift electrode for receiving a fixed potential corresponding to half the clock-pulse amplitude; the surface area of said distributor electrode and the magnitude of the barrier producible by said barrier electrode being selected such that an undesired d.c. component of a signal charge remains beneath the distributor electrode and the a.c. component lies above the barrier; a transverse current path transverse to said first direction and having a drain-off gate for receiving a clock pulse and a drain-off diode connected to said substrate between said distributor and barrier electrodes for drawing off the d.c. component; said fourth shift electrode, and said third and fourth shift electrodes linearly mounted in said first direction following said barrier electrode and arranged adjacent each other and on the side thereof opposite said distributor electrode for receiving shift pulses fifth and sixth shift electrodes and said third and fourth shift electrodes each having a greater surface area than the surface areas of said fifth and sixth shift electrodes.

* * * * *